(12) United States Patent
Lee et al.

(10) Patent No.: US 8,030,108 B1
(45) Date of Patent: Oct. 4, 2011

(54) EPITAXIAL GROWTH OF IN-PLANE NANOWIRES AND NANOWIRE DEVICES

(75) Inventors: Seung Chang Lee, Albuquerque, NM (US); Steven R. J. Brueck, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 236 days.

(21) Appl. No.: 12/492,265

(22) Filed: Jun. 26, 2009

Related U.S. Application Data

(60) Provisional application No. 61/076,803, filed on Jun. 30, 2008.

(51) Int. Cl.
*H01L 21/00* (2006.01)

(52) U.S. Cl. ............ 438/44; 438/22; 438/42; 438/43; 438/48; 257/E21.09

(58) Field of Classification Search ............ 438/22, 438/42, 43, 44, 48
See application file for complete search history.

(56) References Cited

U.S. PATENT DOCUMENTS

| | | | |
|---|---|---|---|
| 6,320,209 B1 * | 11/2001 | Hata et al. | 257/190 |
| 2003/0039286 A1 * | 2/2003 | Doi et al. | 372/45 |
| 2004/0227152 A1 * | 11/2004 | Biwa et al. | 257/103 |

* cited by examiner

*Primary Examiner* — Wai Sing Louie

(74) *Attorney, Agent, or Firm* — MH2 Technology Law Group LLP

(57) ABSTRACT

Exemplary embodiments provide semiconductor nanowires and nanowire devices/applications and methods for their formation. In embodiments, in-plane nanowires can be epitaxially grown on a patterned substrate, which are more favorable than vertical ones for device processing and three-dimensional (3D) integrated circuits. In embodiments, the in-plane nanowire can be formed by selective epitaxy utilizing lateral overgrowth and faceting of an epilayer initially grown in a one-dimensional (1D) nanoscale opening. In embodiments, optical, electrical, and thermal connections can be established and controlled between the nanowire, the substrate, and additional electrical or optical components for better device and system performance.

15 Claims, 9 Drawing Sheets

EPITAXIAL GROWTH OF IN-PLANE NANOWIRES AND NANOWIRE DEVICES

RELATED APPLICATIONS

This application claims priority from U.S. Provisional Patent Application Ser. No. 61/076,803, filed Jun. 30, 2008, which is hereby incorporated by reference in its entirety.

GOVERNMENT RIGHTS

This invention was made with Government support under Contract No. 50615 awarded by the Sandia National Laboratories. The U.S. Government has certain rights in this invention.

FIELD OF THE INVENTION

This invention relates generally to nanowires and, more particularly, to in-plane nanowires, in-plane nanowire devices, and methods for their formation.

BACKGROUND OF THE INVENTION

Along with the physical dimension, the geometric shape significantly affects the electronic states of semiconductor nanostructures such as quantum dots or nanowires. Most nanowires are epitaxially grown on a patterned substrate and are oriented vertical to the substrate surface. For example, the growth of GaAs from an array of circular apertures patterned on a Si(111) substrate, the growth of GaN on a sapphire or a SiC substrate, and the growth of semiconductor nanowires by vapor-liquid-solid (VLS) are generally oriented vertical to the growth substrate. Problems arise when growth not vertical to the substrate is desired. For example, VLS wires are often removed from the growth substrate and repositioned at a different orientation on a second substrate. This is a difficult, low yield processing step, which considerably diminishes the density and practicality of nanowire devices and circuits.

Thus, there is a need to overcome these and other problems of the prior art and to provide in-plane nanowires, related nanowire devices, and methods for their formation along a growth substrate surface.

SUMMARY OF THE INVENTION

According to various embodiments, the present teachings include a method for forming a nanowire. The nanowire can be formed by first providing a crystalline growth platform. A protection layer can then be formed or disposed on the crystal growth platform, followed by forming a selective growth mask on the protection layer. One or more nanoscale slit-shaped openings can be defined in the selective growth mask with a length oriented along a crystal direction of the crystalline growth platform. A portion of the protection layer in vicinity of each nanoscale slit-shaped opening can be locally removed to expose a surface of the underlying crystalline growth platform. In many cases this local removal can be accomplished in the controlled environment of the epitaxial growth reactor, minimizing exposure to laboratory air and associated contaminants. An in-plane nanowire can then be formed by epitaxially growing a material from the exposed surface of the crystalline growth platform through the nanoscale slit-shaped opening of the selective growth mask. In various embodiments, field effect transistor (FET) devices and semiconductor light emitting diodes and lasers can be formed according to this method.

According to various embodiments, the present teachings also include a method for forming a nanowire device. The nanowire device can be formed by providing a protection layer on a crystalline growth platform, while the crystalline growth platform can include layers that either form part of the device or allow post-growth processing to form the device. For example, at least an aluminum (Al)-containing epitaxial layer can be included to allow oxidation after the growth for electrical isolation of the nanowire from the substrate. In other embodiments, the crystalline growth platform can include a multi-layer Bragg reflector to allow for optical isolation of the nanowire from the substrate. In yet other embodiments, the crystalline growth platform can be designed to provide a suitable combination of electrical conductivity and optical isolation between the nanowire device and the crystalline growth platform.

A selective growth mask can be formed atop the protection layer wherein one or more nanoscale slit-shaped openings are defined in the selective growth mask. In vicinity of each nanoscale slit-shaped opening, the protection layer can be locally removed in an epitaxial growth apparatus to expose a surface of the underlying crystalline growth platform. An in-plane nanowire can then be formed by epitaxially growing a material from the exposed surface of the crystalline growth platform through each nanoscale slit-shaped opening, wherein a length of the nanowire can be along a crystal direction of the underlying crystalline growth platform. In addition, the in-plane nanowire can be used as a core material for epitaxially growing a core-shell structure thereon.

In various embodiments, a variety of devices can be formed according to this method. Such nanowire devices can include, for example, high electron mobility transistors (HEMTs), field-effect transistors (FET), electronic nanotube structures, wrapped single quantum wells, one-dimensional quantum dot (QD) arrays, one-dimensional quantum wire arrays; light emitting diodes (LEDs), laser diodes (LDs) or other devices.

According to various embodiments, the present teachings further include a method for forming a nanowire device. The nanowire device can be formed by first forming an in-plane GaAs nanowire core. The in-plane GaAs nanowire core can be formed by first forming an n doped GaAs region, then forming a p-n junction region of an undoped GaAs surrounding the n-doped GaAs region, and then forming a p doped GaAs region surrounding the p-n junction region. Alternatively, the undoped region can be formed of a lower bandgap material, including but not limited to InGaAs, to provide localization of the electrons and holes. Following formation of the in-plane nanowire core, a shell layer can be formed surrounding the in-plane GaAs nanowire core and can be formed of AlGaAs having a GaAs/AlGaAs interface with the in-plane GaAs nanowire core. Such interface can include a plurality of cladding pairs formed by parallel faceted regions of the in-plane GaAs nanowire core. The nanowire device formed herein can include a laser diode (LD).

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
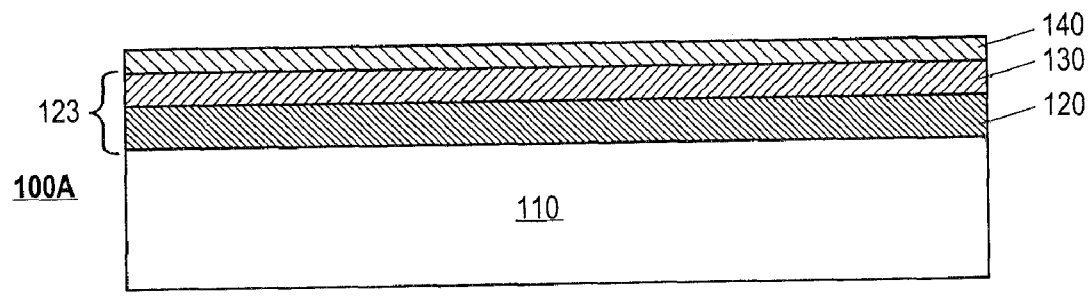
FIGS. 1A-1F depict an exemplary nanowire device at various stages of fabrication in accordance with various embodiments of the present teachings.

Reference will now be made in detail to exemplary embodiments of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Exemplary embodiments provide semiconductor nanowires and nanowire devices/applications and methods for making nanowires and related devices. According to various embodiments, in-plane nanowires can be epitaxially grown on a patterned substrate, which are more favorable than vertical ones for device processing and three-dimensional (3D) integrated circuits. In embodiments, the in-plane nanowire can be formed by selective epitaxy utilizing lateral overgrowth and faceting of an epilayer initially grown on a one-dimensional (1D) nanoscale opening. In embodiments, one or more protection layers can be used, for example, during patterning process of the growth mask, during growth process of the nanowire, and/or during fabrication process of related nanowire devices. In embodiments, optical, electrical, and thermal connections can be established and controlled between the nanowire, the substrate, and additional electrical or optical components for better device and system performance.

In various embodiments, the nanowires and the related devices can be formed in a whole wafer or in selective regions of a wafer defined through methods such as physical masks or etching process known to one of ordinary skill in the art. A wafer substrate surface can be defined as in plane of x-y where, for example, x-direction can be perpendicular to a length of nanowire and the y-direction can be parallel to the length, and the z-direction can be perpendicular to the substrate surface. Typically, a wafer can have a thickness of less than about 1000 μm.

As used herein, the term "nanowire" generally refers to any elongated conductive or semiconductive structure that includes at least one minor dimension, for example, one of the cross-sectional dimensions such as width or diameter, of less than or equal to about 1000 nm. In various embodiments, the minor dimension can be less than about 500 nm. In various other embodiments, the minor dimension can be less than about 100 nm. In various embodiments, the nanowire can have a length ranging from sub-100 nanometers to about 1 cm or longer. In various embodiments, the nanowire can be formed in-plane, in other words, having its length situated along the underlying substrate surface in (x-y) plane. In embodiments, the in-plane length can be determined to match a desired length of nanowire device. In various embodiments, the minor dimension of an in-plane nanowire, for example, along x-direction in x-y plane can be comparable with the dimension of the in-plane nanowire in the z-direction.

It is intended that the term "nanowire" also encompass other elongated nano-structures of like dimensions including, but not limited to, nanoshaft, nanopillar, nanoneedle, nanorod, and nanotube. The nanowires can have various cross-sectional shapes, for example, a rectangular, a polygonal, a square, an oval, a circular shape or the like. In specific embodiments, the nanowires can have a cross sectional shape that includes a pentagon, hexagon or any polygons formed by faceting. In various embodiments, a plurality of nanowires can be formed, for example, substantially parallel, perpendicular, etc., with respect to each other.

The disclosed nanowires that are in-plane oriented along the substrate surface can be formed in defined positions, which in embodiments can be suitable for further device processing after the growth. The device processing can be performed similar to traditional semiconductor devices but providing high density and high yield. Additionally, by adding structures to the selective growth pattern as disclosed herein, various additional functionalities can be incorporated with the in-plane nanowire and its device, for example, larger-area contact pads can be formed for subsequent electrical connectivity.

A variety of crystal growth (i.e., epitaxy) methods including, but not limited to, metal-organic chemical vapor deposition (MOCVD), molecular-beam epitaxy (MBE), gas source MBE (GSMBE), metal-organic MBE (MOMBE), atomic layer epitaxy (ALE), hydride vapor phase epitaxy (HVPE), or organometallic vapor phase epitaxy (OMVPE), can be used to prepare the disclosed nanowires and nanowire devices.

In various embodiments, the nanowires and related devices/applications can include one or more materials selected from the group consisting of materials systems of groups III-V, II-VI, and/or IV. For ease of illustration, the invention will be described with reference to materials and manufacturing processes of the exemplary III-V materials systems, which includes, for example, III-V semiconductor alloy compositions.

In the following description, the semiconductor alloy compositions can be described by the combination of elements, such as, for example, AlAs, GaAs, InAs, AlSb, GaSb, InSb, AlP, GaP, InP, AlN, GaN, InN, Si, Ge, CdTe, HgTe, ZnSe, and all ternary, quaternary and quinary alloys thereof. Generally, the elements in a composition can be combined with various molar fractions. For example, the semiconductor alloy composition AlGaAs can stand for $Al_{(x)}Ga_{(1-x)}As$, where the molar fraction, x, can be any number less than 1.00 and greater than 0.

In the III-V materials system, examples of the group III elements can include Ga, In or Al, which can be formed from exemplary respective group III precursors, such as trimethylgallium (TMGa) or triethylgallium (TEGa), trimethylindium (TMIn) or trimethylaluminum (TMAl). In the III-V materials system, exemplary group V elements can include As, Sb, N, or P. Exemplary group V precursors, such as arsine ($AsH_3$), ammonia, or tertiarybutylphoshine (TBP) can be used to provide corresponding exemplary elements such as As, N, or P.

FIGS. 1A-1F depict an exemplary nanowire device 100 at various stages of fabrication in accordance with various embodiments of the present teachings. The cross sectional schematics in FIGS. 1A-1F are shown on the x-z plane that is perpendicular to the y-direction which is along a length of the exemplary in-plane nanowire.

As shown in FIG. 1A, the device 100A can include a protection layer 140 formed over a crystalline growth platform 123 including a growth surface 130 over a blanket epilayer 120, which can be formed over a substrate 110.

In embodiments, the substrate 110 can include, for example, silicon, SiC, $Al_2O_3$, Ge, GaN, GaAs, GaSb, InP, CdTe, and/or ZnSe.

The crystalline growth platform 123 including the blanket epilayer 120 and the overlaying growth surface 130 can be formed by an epitaxial growth. In embodiments, the crystalline growth platform 123 can include other functional layers epitaxially grown for specific devices and applications.

The blanket epilayer 120 can be a planar semiconductor epilayer formed of, for example, GaAs, AlAs, InAs, InGaAs, AlInGaAs or AlGaAs. In embodiments, the blanket epilayer 120 can include blanket heteromaterial(s) or stacked layers. In embodiments, the blanket epilayer 120 can include one or more Al-containing layers. In various embodiments, the blanket epilayer 120 of the nanowire growth platform 123 can include an Al mole fraction suitable for a subsequent selective oxidation for nanowire devices.

The crystalline growth platform 123 can also provide a growth surface 130 over the blanket epilayer 120 for the subsequent epitaxial nanowire growth as well as growth of nanowire devices as disclosed herein. In various embodiments, the crystalline growth platform 123 can have various designs engineered to enable desired device performance of various final structures.

In one example, the crystalline growth platform 123 can use a blanket epilayer 120 having high Al mole fractions to allow for local oxidation after the nanowire growth. The oxidized blanket epilayer (see 190 in FIG. 1F) can then provide electrical isolation of an active region from any defects in the substrate 110. In embodiments, this crystalline growth platform 123 can include a multi-layer stack as is commonly used in III-V semiconductor devices.

In another example, it is desirable to provide a multilayer stack for the crystalline growth platform 123, for example, a distributed Bragg reflector to enhance the optical isolation of the subsequently formed nanowire device from the substrate 110.

In various embodiments, these examples described above are not intended to be exclusionary, and other blanket layer structures or crystalline growth platform can find applications depending on the specifics of the desired nanowire device functionality.

In various embodiments, the blanket heteromaterials of the crystalline growth platform 123 can be different from the substrate 110 and/or the subsequently formed nanowire in material composition depending on specific applications. For example, in some embodiments for FET devices wherein electrical isolation from the substrate 110 is desirable, a large Al concentration layer can be incorporated in the blanket layer 120 of the crystalline growth platform 123 and subsequently locally oxidized during device fabrication so as to provide electrical isolation from the substrate 110.

In other embodiments, for example, for electrically pumped laser devices (LD) where electrical contact is provided to the substrate 110, a multilayer stack, e.g., having different Al compositions, can be used for the blanket epilayer 120 of crystalline growth platform 123 to balance the requirements of electrical connectivity and optical isolation. In still other embodiments, the use of Al in the composition of other layers of the crystalline growth platform 123 can be avoided to address concerns related to long-term stability and reliability.

Figure 1B:
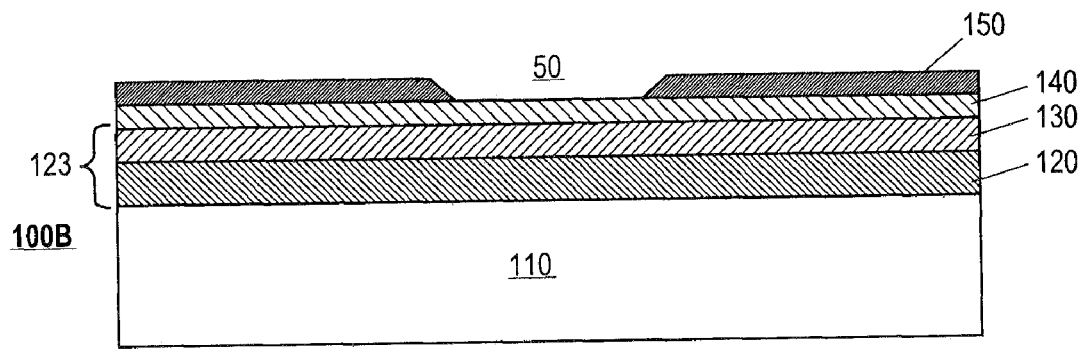

Referring back to FIG. 1A, the protection layer 140 can be deposited on the crystalline growth platform 123 in order to isolate the growth surface 130 of crystalline growth platform 123 during fabrication of the following patterned selective growth mask 150, which is shown in FIG. 1B.

In various embodiments, the protection layer 140 can be, for example, an amorphous semiconductor, a dielectric layer, or a group V film. As described herein, the protection layer 140 can provide certain advantages. For example, the protection layer can protect the underlying epitaxial growth surface from exposure to atmospheric ambient, from exposure to residual hydrocarbons, oxygen, and other types of contaminants from the subsequent deposition and patterning of selective growth mask 150 in FIG. 1B. Additionally, the protection layer 140 can be locally removed in the growth areas defined by the patterned growth mask 150 in the epitaxial growth chamber prior to the nanowire growth either by heating or by an in-situ etching/cleaning process. This local removal can expose a nanowire growth surface for a continuous nanowire growth.

FIG. 1B can include a patterned selective growth mask 150 including one or more one-dimensional (1D) nanoscale slit-shaped or stripe openings 50, narrow and long, patterned in the selective growth mask 150.

Prior to the formation of the patterned selective growth mask 150, the processing device 100A can be removed from the epitaxy machine and can further be processed to define the selective growth mask. In one embodiment, the patterned selective growth mask 150 can be formed by, for example, 1) depositing a blanket layer of an amorphous material that is dielectric; and 2) using suitable lithographic and etching processes to define nanoscale, 1D stripe openings 50 through the selective growth mask 150 exposing the underlying protection layer 140.

Many such lithographic processes can be employed including, but not limited to, optical lithography, interferometric lithography, nanoimprint lithography, electron-beam lithography, or ion-beam lithography. In various embodiments, suitable etching processes can be used to transfer the lithographic pattern from photoresist to the selective growth mask layer and the remaining photoresist can be removed to leave the selective growth mask.

In various embodiments, the patterned growth mask 150 can include a dielectric material including, but not limited to, $SiO_2$, $Si_3N_4$, $Al_2O_3$, or other dielectric materials known to one of ordinary skill in the art.

The nanoscale, 1D stripe openings 50 defined by the patterned growth mask 150 on the protection layer 140 can have a length in-plane (x-y) along the substrate surface. In various embodiments, the in-plane length can range from less than about 100 nm to more than about 1 cm. In other words, any desirable length can be fabricated and used for the opening 50. For example, the length of the opening 50 can be adjusted to match a desired device length.

In various embodiments, the width of the opening 50 can be related to, but smaller than or comparable to a width or diameter of a final nanowire. In embodiments, the width of the opening 50 can range from about 10 nm to about 1 μm, although other width can be possible for the 1D stripe openings 50.

In various embodiments, the length of nanoscale, 1D stripe openings 50 can be oriented substantially along a specified direction of the underlying substrate crystal of the crystalline growth platform 123, where lateral overgrowth and faceting for the in-plane nanowire can be available. For example, in many cases of III-V materials systems, the length direction can be a <110> direction of the underlying bulk (100) substrate, although other directions are possible on the substrates different from (100).

In various embodiments, the patterning of the selective growth mask 150 can include additional features, for example, larger-area contact pads, in addition to the 1D slit-shaped openings 50 for the subsequent nanowire growth.

Figure 1C:
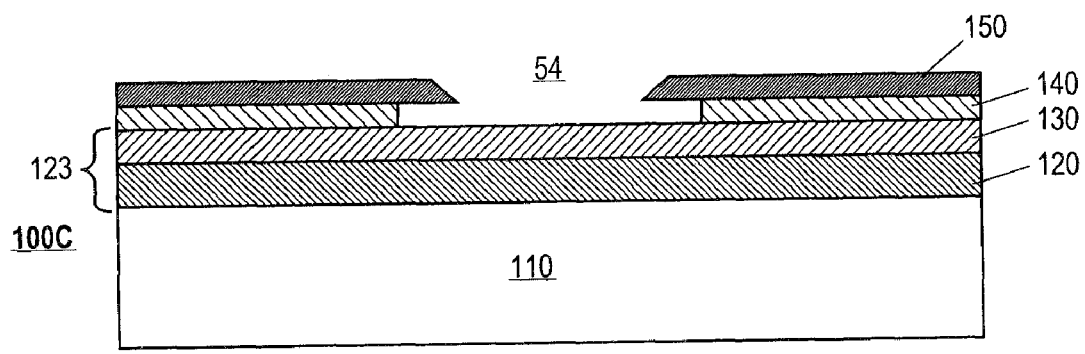

In FIG. 1C, a portion of the protection layer 140 associated with the 1D stripe opening 50 can be removed using the patterned selective growth mask 150 as a hard mask for example. An opening 54 can be formed by removing the associated protection portion that is in the vicinity of the slit-shaped opening 50. The protection portion can be removed either thermally or chemically, or by supplying cracked hydrogen atoms to the associated surface, exposing a corresponding portion of the underlying growth surface 130.

In various embodiments, the patterned substrate device 100C shown in FIG. 1C can then be loaded into a growth chamber for epitaxial growth of nanowires, for example, after a cleaning process. In various embodiments, the opening 54 can be formed in the growth chamber for an in-situ epitaxial growth of nanowire in the opening and from the exposed crystalline growth surface 130 in order to avoid contamination of the growth surface 130 from atmospheric substances.

Figure 1D:
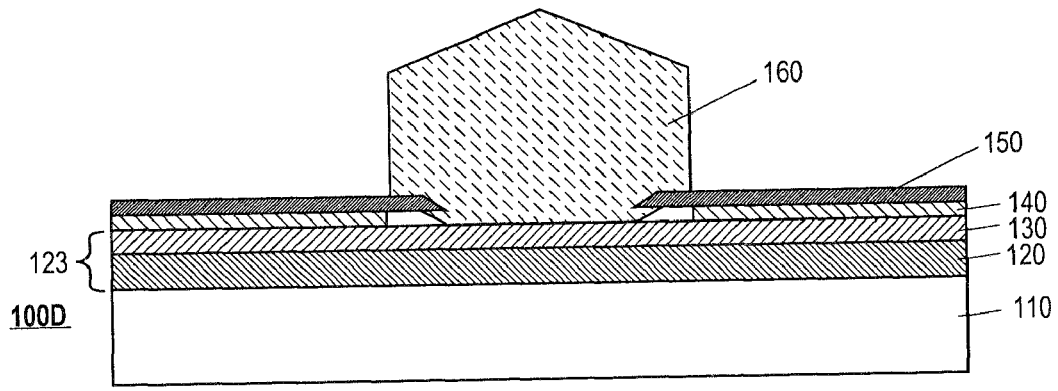

In FIG. 1D, a nanowire 160 can be formed, e.g., epitaxially grown in-plane (x-y) from the exposed portion of the growth surface 130 through the opening 54 of the device 100C. By controlling growth parameters and deposition amount, the epilayer can have a cross section on the x-z plane perpendicular to y-direction, which has comparable dimensions in both x- and z-direction on the substrate surface.

Figure 1E:
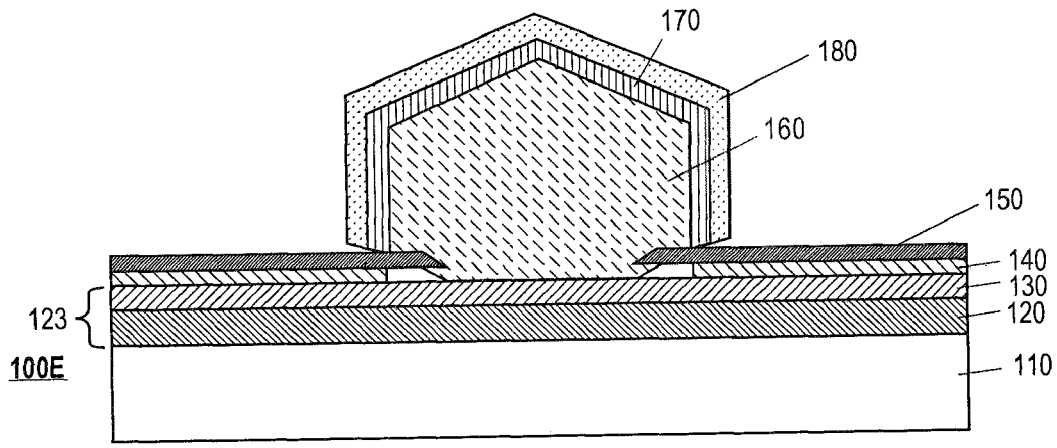

FIG. 1E shows a schematic of the nanowire structure passivated by the epitaxial growth of a nanowire heteromaterial stack which includes, in this specific case, two layers: a first nanowire heteromaterial as a cladding layer 170, with a bandgap different from that of the nanowire 160, and a second nanowire heteromaterial as a capping layer 180.

During formation, for in-situ passivation of the nanowire surface, a larger bandgap layer, for example in the case of GaAs growth, a high or medium Al-composition layer, can be deposited onto the nanowire 160 as the cladding layer 170.

In general, multiple layers can be used for specific functionalities such as passivation of surface defects, optical and/or electrical confinement, chemical isolation in subsequent processing, etc. In the example above, the capping layer 180 can include a final GaAs capping layer added to the cladding layer 170 to isolate the Al-containing material of the cladding layer 170 from the environment during processing and device operation. The use of multiple epitaxial layers to provide various functionalities is well known in III-V device processing and is incorporated herein without limitations.

Figure 1F:
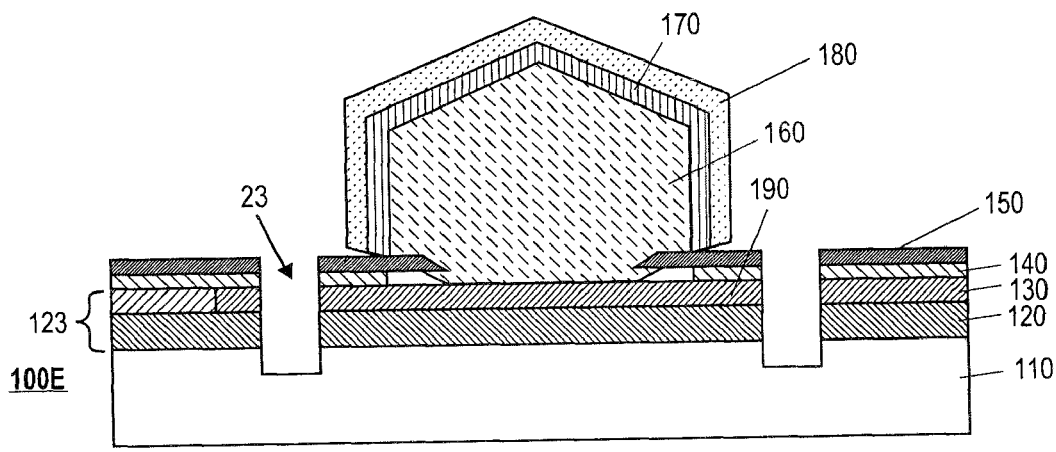

In FIG. 1F, to complete nanowire formation process, for example, trenches 23 can be fabricated around the nanowire 160 to facilitate lateral oxidation of the blanket heteromaterial layer 120 of the growth platform 130 which has a high Al composition. Oxidized layer 190, and/or metal contacts (not illustrated) can be fabricated, e.g., for formation of electrical/optoelectronic devices. In one embodiment, trenches 23 can provide access to the oxygen reactant for a local thermal oxidation of the high Al-composition layer under the nanowire 160.

Figure 2A:
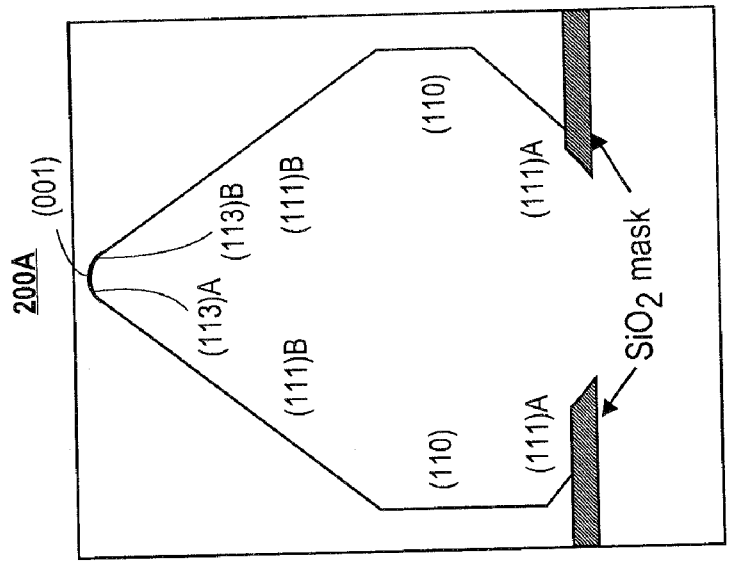
FIG. 2A depicts dominant facets generated on an exemplary nanowire in accordance with various embodiments of the present teachings.
Figure 2:
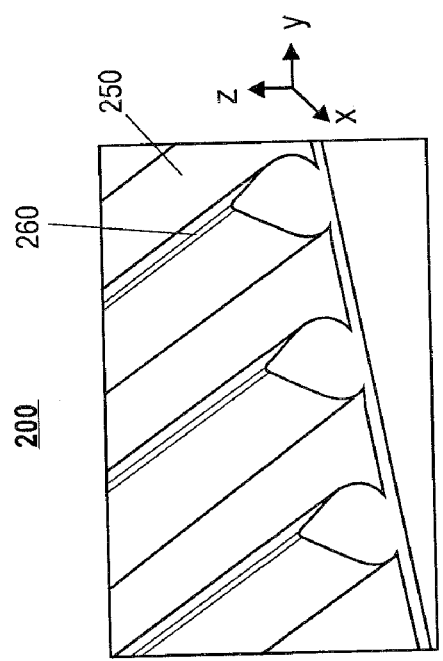
FIG. 2 depicts an exemplary nanowire array in accordance with various embodiments of the present teachings.

FIG. 2 depicts an exemplary nanowire array 200 in accordance with various embodiments of the present teachings.

As shown, the array 200 can include a plurality of nanowires 260 formed in the x-y plane (as indicated by the xyz-axis system in FIG. 2) defined by a patterned selective growth mask 250. In various embodiments, the nanowire 260 can be formed using the materials and methods as described in FIGS. 1A-1F.

In various embodiments, the plurality of nanowires 260 can be formed to have a center-to-center spacing between adjacent two nanowires. In various embodiments, the center-to-center spacing can range from about 50 nm to about 5 μm. In embodiments, large center-to-center spacing can allow uninterrupted faceting without coalescence between adjacent nanowires. For example, the large center-to-center spacing can range from about 0.5 μm to about 5 μm, although other center-to-center spacing can be possible for various embodiments of the present teachings.

In an exemplary embodiment, the nanowire can be a GaAs nanowire formed by using a 30-nm thick $SiO_2$ film patterned atop a GaAs(001) substrate by i-line interferometric lithography and dry etching. The pattern can include 200-nm wide, 1D open stripes directed along a [110] substrate direction with a center-to-center spacing of about 1.26 μm. In a specific embodiment, a narrow opening and a thin $SiO_2$ film can be favorable for the early initiation of lateral overgrowth and the associated faceting of nanowires 260. On this specific patterned substrate, GaAs can be deposited using trimethylgallium (TMGa) and arsine at, e.g., about 720° C. A 500-nm film thickness, calibrated on an unpatterned wide-area substrate, and a growth rate of ~0.2 monolayer/s at a V/III ratio of ~300 can be obtained. In OMVPE, every facet can be assumed to be exposed to equal partial pressures of TMGa and arsine, which encourage the faceting driven by the minimization of total surface energy for the formation of in-plane nanowires.

FIG. 2A depicts dominant facets generated on the formed exemplary GaAs nanowire of FIG. 2 in accordance with various embodiments of the present teachings. For example, the dominant facets can include (111)B-, (110)-, and (111)A-types. In one example, the width of the as-grown nanowire can be about 580 nm, considerably greater than the original 200-nm stripe opening.

FIG. 2A indicates that lateral growth can occur over the exemplary $SiO_2$ mask in both directions. In various embodiments, (113)B- and (001)-type facets can also be observed with lengths significantly smaller than those of the dominant facets. On the other hand, no additional facets can be generated at the (111)B-(110) and (110)-(111)A intersections. Thus, the facets on the nanowire can include (001) at the top, (113)B-, (111)B-, (110)-, and (111)A-types. For convenience, these can be categorized into two groups based on their physical dimensions along the nanostructure: major [(111)B, (110), and (111)A] and minor [(001) and (113)B] facets.

Figure 2B:
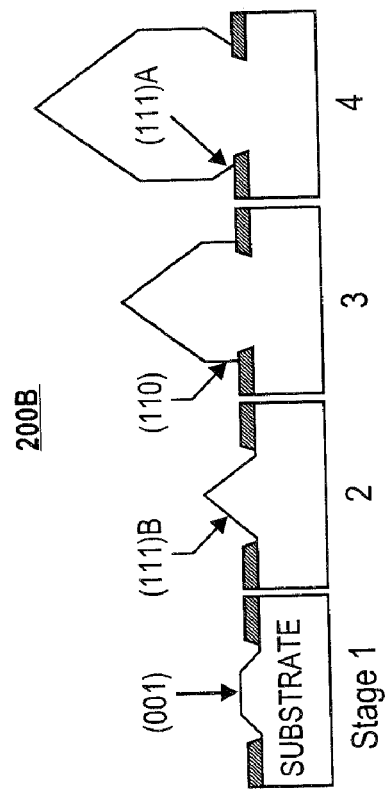
FIG. 2B depicts an evolution process of major facets for forming an exemplary nanowire in accordance with various embodiments of the present teachings.

FIG. 2B depicts an evolutionary process of major facets on a pattern directed to [110] in accordance with various embodiments of the present teachings. The faceting can start with (001) resulting in a trapezoidal cross section of an initial epilayer at stage 1. The (111)B facets can extend until the cross section becomes a triangle at stage 2. As growth continues, a (110) vertical facet can then be generated at the end of each (111)B with the initiation of lateral overgrowth at stage 3. With further growth, (111)A facets can be noticed at stage 4 as what shown in FIGS. 2-2A.

In this manner, the in-plane nanowire can be formed by selective epitaxy utilizing lateral overgrowth and faceting of an epilayer initially grown on a one-dimensional (1D) nanoscale slit-shaped opening.

The faceting of an epilayer initially grown on a 1D stripe opening on a substrate can follow the principle of equilibrium crystal shape (ECS). The faceting by ECS can be affected by substrate orientation and growth parameters including deposition rate and deposition amount. Depending on these conditions, lateral overgrowth and ECS can drive the cross section perpendicular to the long direction of the 1D stripe opening of the epilayer to a shape close to that of, for example, a regular pentagon, hexagon, or other polygons, and the overall 3D shape of the epilayer can become close to that of the vertically oriented nanowires.

In various embodiments, lithography techniques can be available to reduce the width of patterned openings to deep sub-micrometer range where the in-plane nanowires can exhibit quantum or low-dimensional effects as well as providing optical mode confinement along the nanowire. Additionally, as discussed below, core-shell growth processes can be available having the formed nanowire as a core material, which allows application of the full apparatus of III-V crystal growth including quantum wells (QWs) and quantum dots (QDs). In various embodiments, the epitaxially grown in-plane nanowires can be used in various applications, for example, transistor devices including FETs, or HEMTs, and optical generation devices, such as light emitting diodes (LED), or laser diodes (LD), using nanowire-based QWs, QDs, quantum wires or nanotubes.

Figure 3A:
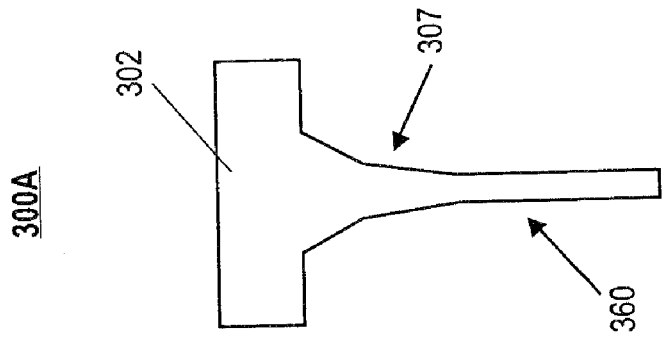
FIG. 3 depicts an exemplary field effect transistor (FET) device formed from an exemplary nanowire in accordance with various embodiments of the present teachings.
Figure 3:
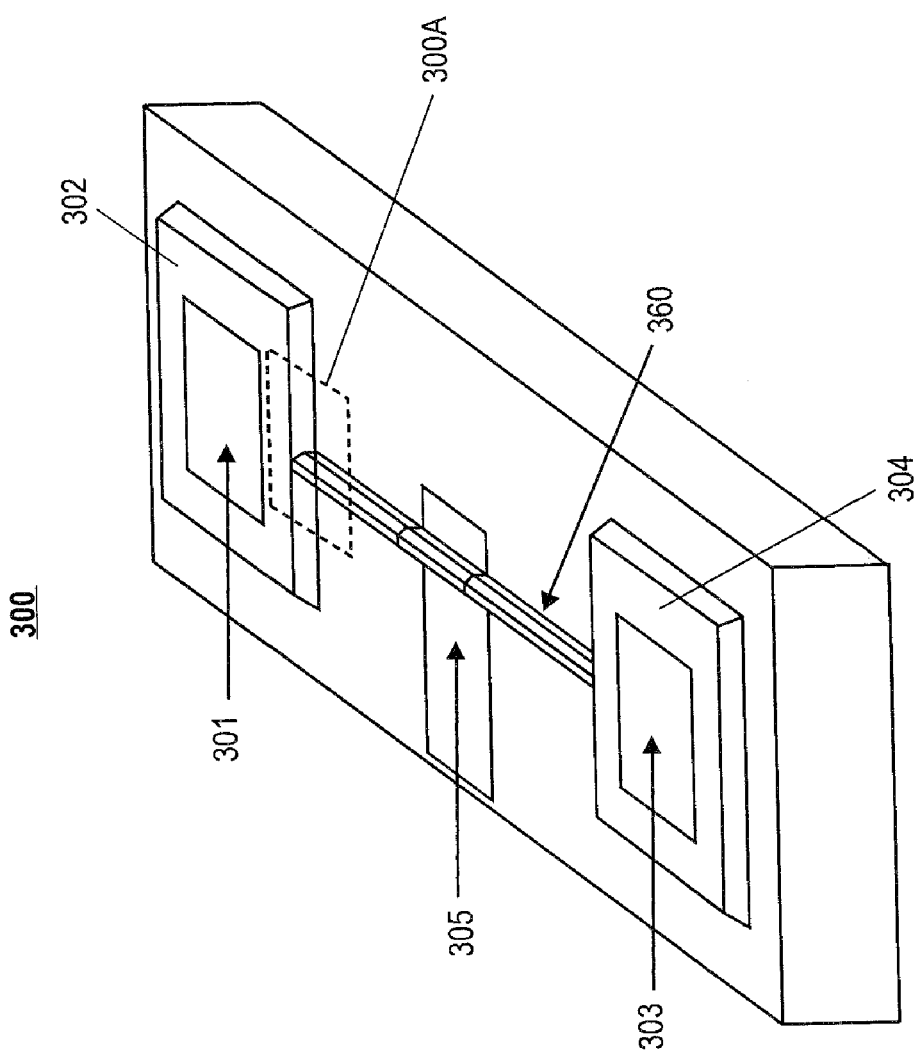

FIG. 3 depicts an exemplary FET device 300 in accordance with various embodiments of the present teachings. FIG. 3A depicts a close-up schematic for a junction 300A of contact pad 302 and nanowire 360 of the device 300.

With n or p doping of the nanowires, several types of 1D FETs can be formed. Heavily doped contact pads 302, e.g., for a source of FET, and 304, e.g., for a drain of FET, can be grown separately from the nanowire 360, for example, by a two-step growth including lithographic process and etch process. Selective ion-implantation on the contact pad areas and annealing for electrical activation 301 (e.g., for the source) and 303 (e.g., for the drain), can also be performed.

In various embodiments, the contact pads 302/304 can be grown along with the nanowire 360 in a single growth step. As shown in FIG. 3A, a tapered junction 307 for epitaxial growth near the junction of the nanowire 360 and the contact pad 302 can be formed for better conductance and smoother structural connection, which may be impacted by the faceting formed on those two regions. If necessary, various nanowire growth layers similar to those shown in FIGS. 1A-1F, for example, the protection layer 140 and the selective growth mask 150, can be selectively removed from the top of the area for contact pads to reduce ohmic resistance properties.

In this embodiment, because three sides of the nanowire are exposed to the gate potential, a wrap-around gate scheme can be obtained in which the current control can be improved compared with a simple top contact. For some applications, in order to obtain larger current carrying capability a parallel array of nanowires 360 with common source and drain contacts can be included herein for the present teachings.

Figure 4:
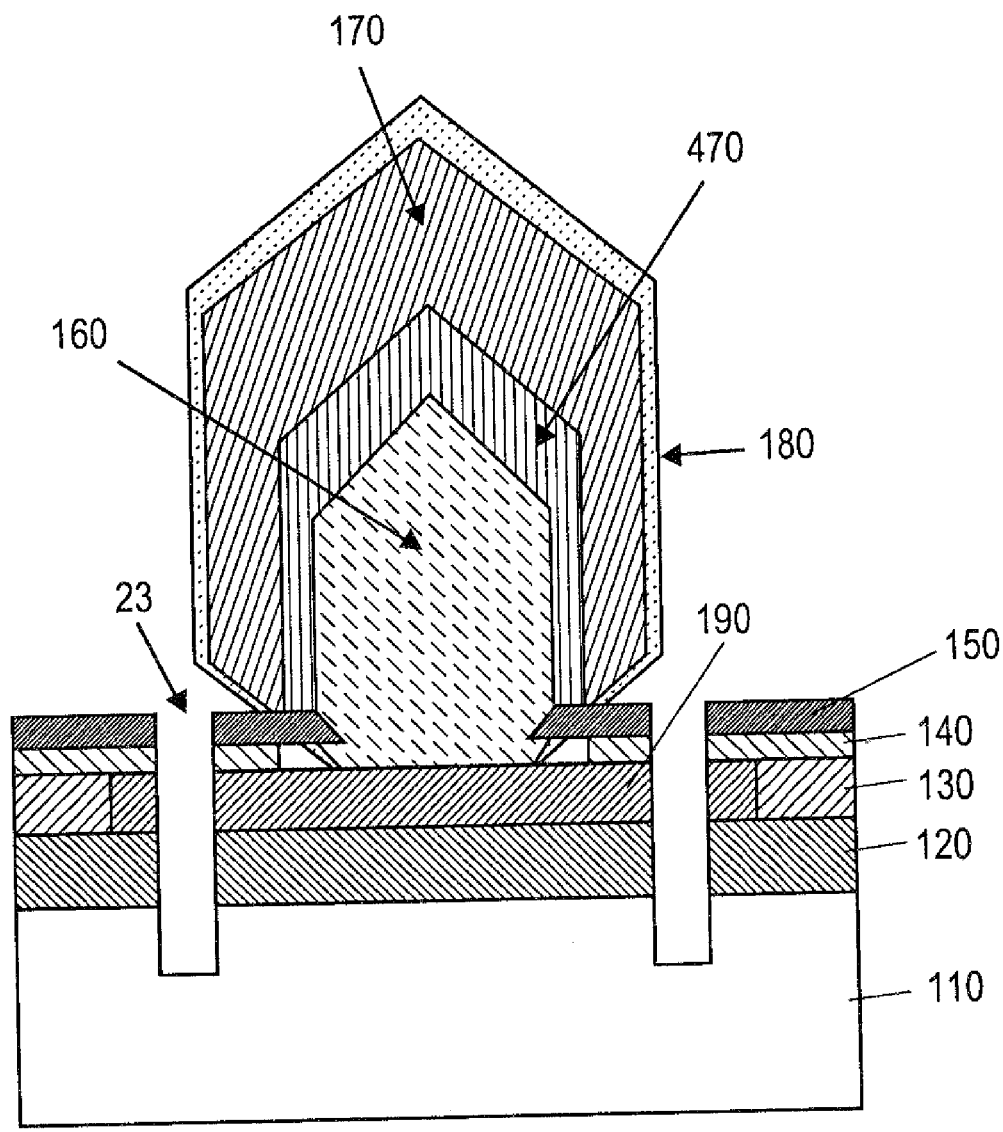
FIG. 4 depicts an exemplary high electron mobility transistor (HEMT) formed from an exemplary nanowire in accordance with various embodiments of the present teachings.

FIG. 4 depicts an exemplary HEMT device 400 formed from the fabricated nanowires in accordance with various embodiments of the present teachings. For example, the HEMT device 400 can have a similar structure as shown in FIG. 1F, except a nanowire heteromaterial 470 can be formed between the nanowire core 160 and the cladding layer 170. In one embodiment, the cladding layer 170 and/or the capping layer 180 can include nanowire heteromaterials including a medium Al-composition, so that it can be utilized for the realization of 1D HEMTs by keeping the nanowire 160 undoped and adding dopants to the medium Al-composition layer 170. In various embodiments, the nanowire core 160 can include undoped GaAs; the overlaying nanowire heteromaterial 470 can include undoped $Al_xGa_{(1-x)}As$; and the cladding layer 170 can include doped $Al_xGa_{(1-x)}As$ surrounded by the cladding layer 180.

Figure 5:
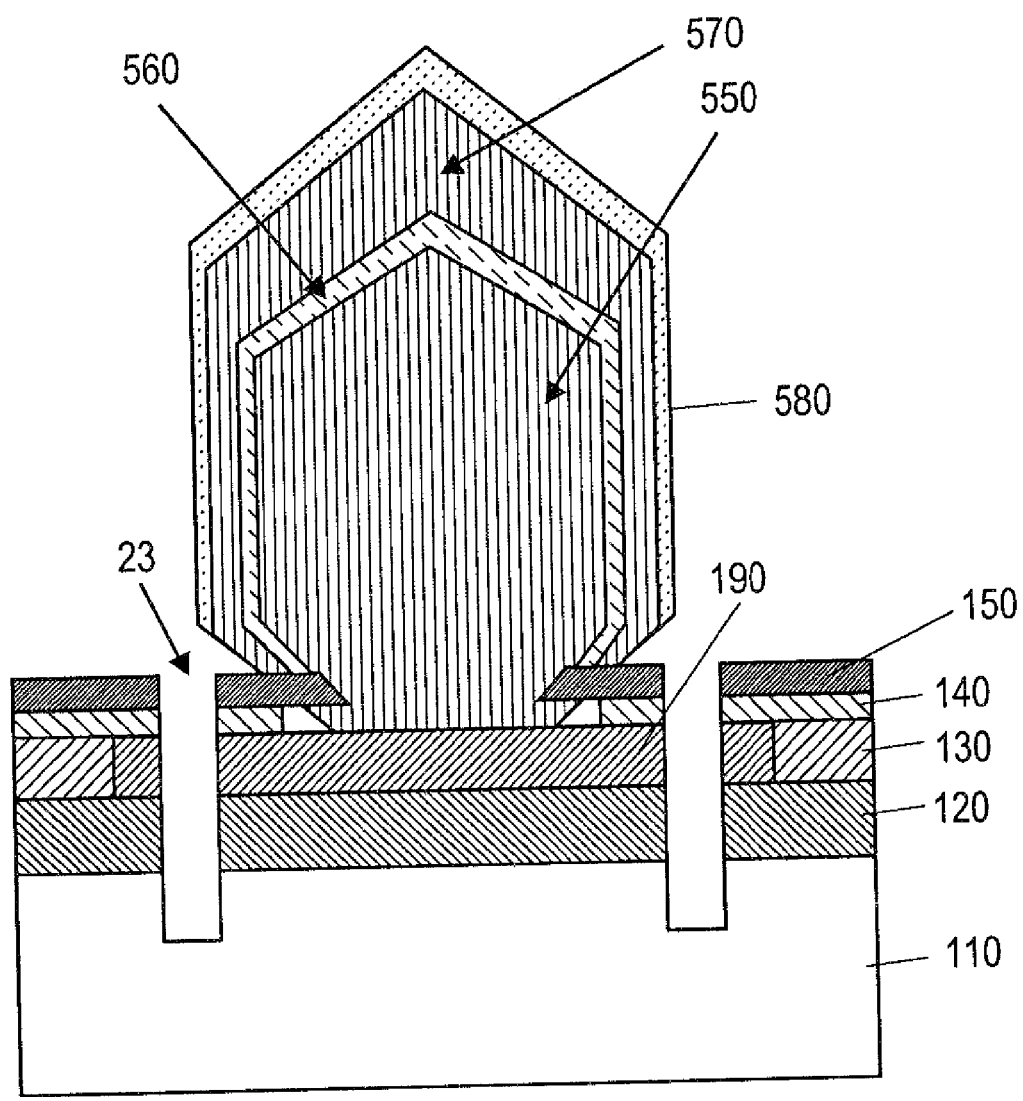
FIG. 5 depicts an exemplary device for a wrapped single quantum well or an electronic nanotube structure formed from an exemplary nanowire in accordance with various embodiments of the present teachings.

FIG. 5 shows an exemplary device 500 used for a wrapped single quantum well (QW) or an electronic quasi-nanotube structure in accordance with various embodiments of the present teachings. For example, when preparing nanowires at the stage shown in FIG. 1C, the formation procedure can be controlled by growing, e.g., a large bandgap material 550 such as a core of $Al_xGa_{1-x}As$ first, then a small bandgap layer 560 such as a shell layer of GaAs, and a large bandgap material 570 again such as another shell layer of $Al_xGa_{1-x}As$, which is capped by a capping layer 580.

The illustrated wrapped quantum well (QW) structure along the nanowire can have potential applications in optical and electrical devices. The various facets of the quantum well (QW) can have different thicknesses. This can result in coupled quantum well (QW) phenomena and may provide new functionality. In various embodiments, the exemplary GaAs layer 560 of a quantum well (QW) structure can have a thickness ranging from about 1 nm to about 100 nm, which can depend on the orientation of the facets formed on the in-plane nanowire. The exemplary $Al_xGa_{1-x}As$ layer 570 of the QW structure can have a thickness ranging from about 50 nm to about 1000 nm. Other possible thicknesses can be used for the exemplary GaAs layer 560 and the exemplary $Al_xGa_{1-x}As$ layer 570 in various embodiments of the present teachings.

Figure 6:
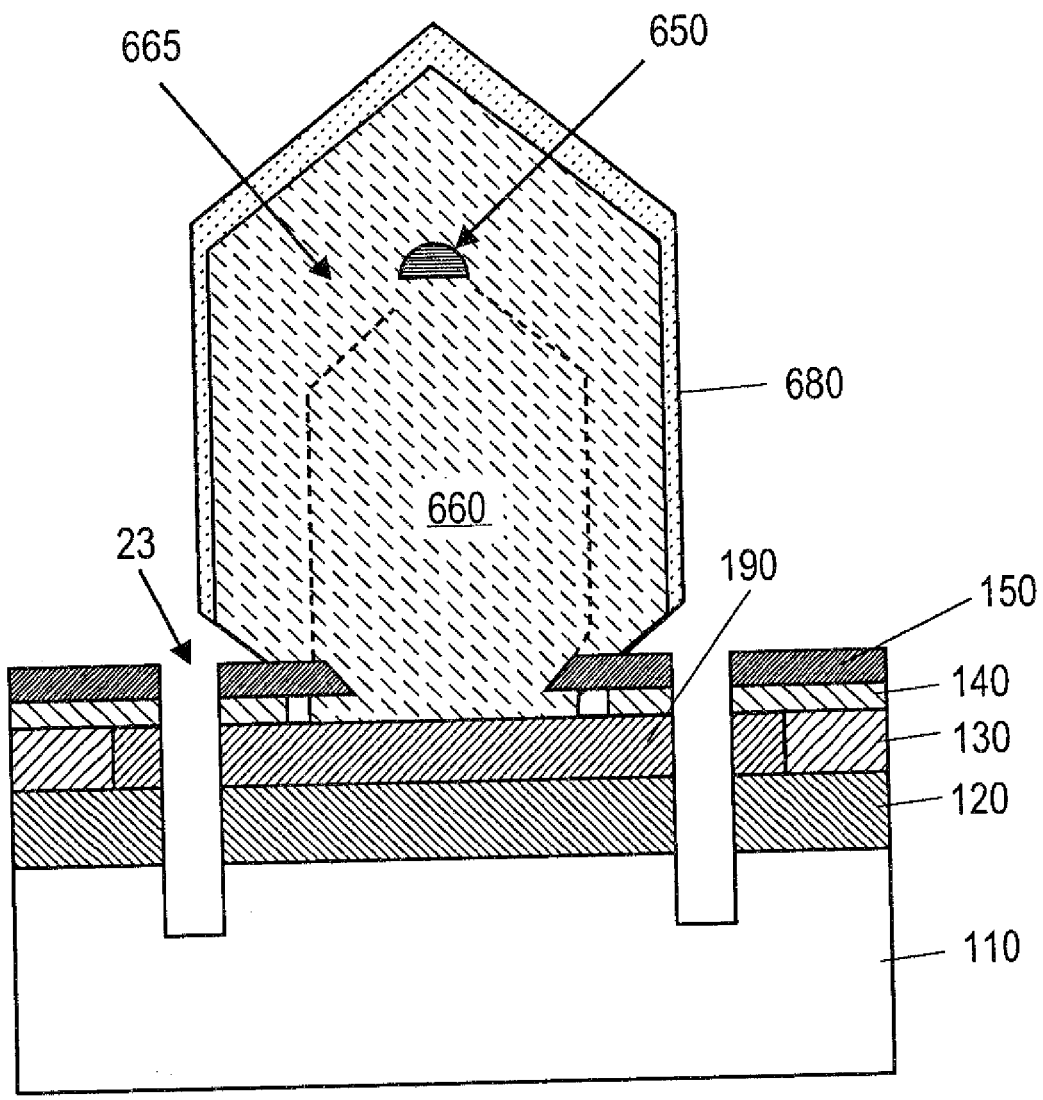
FIG. 6 depicts an exemplary quantum dot (QD) array formed from an exemplary nanowire in accordance with various embodiments of the present teachings.

FIG. 6 depicts a further example of a 1D quantum dot (QD) array formed from the disclosed nanowire of FIG. 1. It has been confirmed that a nanoscale (001) facet can be maintained at the top of the nanowire grown on a (001) substrate (also see FIG. 2A). This facet can be utilized for the growth of a 1D array of QDs or a quantum wire, or any optical/electrical materials.

For example, the QDs or quantum wire 650 can be formed on a (001) facet of the nanowire core 660. The QD or quantum wire 650 can include, for example, InAs. Following the formation of the QD or quantum wire 650, the nanowire core 660, such as GaAs, can continue to grow to form a shell layer 665 of exemplary GaAs surrounding the nanowire core 660 along with the QD or quantum wire 650, such as InAs, which is further caped by the capping layer 680.

In various embodiments, optical generation devices such as light emitting diodes (LEDs) or LDs can be formed using nanowire-based structures. For example, a p-n junction can be fabricated transversely along the nanowire so that electrical pumping can efficiently create electron-hole pairs along the majority of the length of the nanowire device structure.

In one embodiment, a blanket doped $Al_xGa_{1-x}As$ layer can be grown as the first blanket heteromaterial of the crystalline growth platform 123 atop the substrate 110 and then be capped with an amorphous semiconductor or dielectric layer as a protection layer 140 as discussed in FIGS. 1A-1F. The blanket doped $Al_xGa_{1-x}As$ layer of the crystalline growth platform 123 can be a low- or medium Al-composition layer used for device isolation from the substrate 110 and can serve to clad the nanowire waveguide and prevent optical leakage into the substrate 110.

Undergoing the patterning process shown in FIG. 1B, the layer structure can be returned to the growth chamber and the protection layer 140 can be removed in the growth chamber or an etch chamber connected to the growth chamber in vacuum. The exemplary doped $Al_xGa_{1-x}As$ epitaxial layer of the growth platform 123 can be exposed in-situ as a substrate for nanowire growth.

Growth then proceeds, first with an initial epilayer with the same doping as the substrate 110 and the underlying $Al_xGa_{1-x}$ As layer. The initial nanowire growth can have a lower (or zero) Al composition than that of the blanket $Al_xGa_{1-x}As$ layer of the growth platform 130, for example, GaAs, to provide optical confinement. A lower bandgap material (e.g. $In_xGa_{1-x}As$) can be grown in a wrap-around QW geometry as illustrated in FIG. 4 but with different material scheme. It is desirable to locate this quantum well in the depletion region between the n- and p-type dopings for maximum carrier capture into the well. A nanowire heteromaterial having higher bandgap than the QW can then be grown as a cladding layer, and finally a capping layer to prevent oxidation of the Al-containing layers can be grown. This structure can serve as either a LED or a LD.

In embodiments, the active region can include a lower bandgap material, such as for example, InGaAs, and the use of Al in any of the device layers can be avoided. As the growth proceeds, the dopant can be switched to provide a concentric (radial) p-n junction along the nanowire. If this is done after the initiation of lateral overgrowth, the formation of an electrical short between the p- and n-type layers or the intermixing of different types of dopants along the multiply faceted growth front surface during epitaxy can be avoided. This is because each doped layer grown on the nanowire 160 can be terminated at the top surface of the dielectric mask 150 on both sides, which provides a complete structural and electrical isolation of each layer from subsequent layers grown on it. Alternatively, etching can be used to shorten the nanowire 160 and eliminate any high-field regions at the ends of the nanowire 160.

Figure 7:
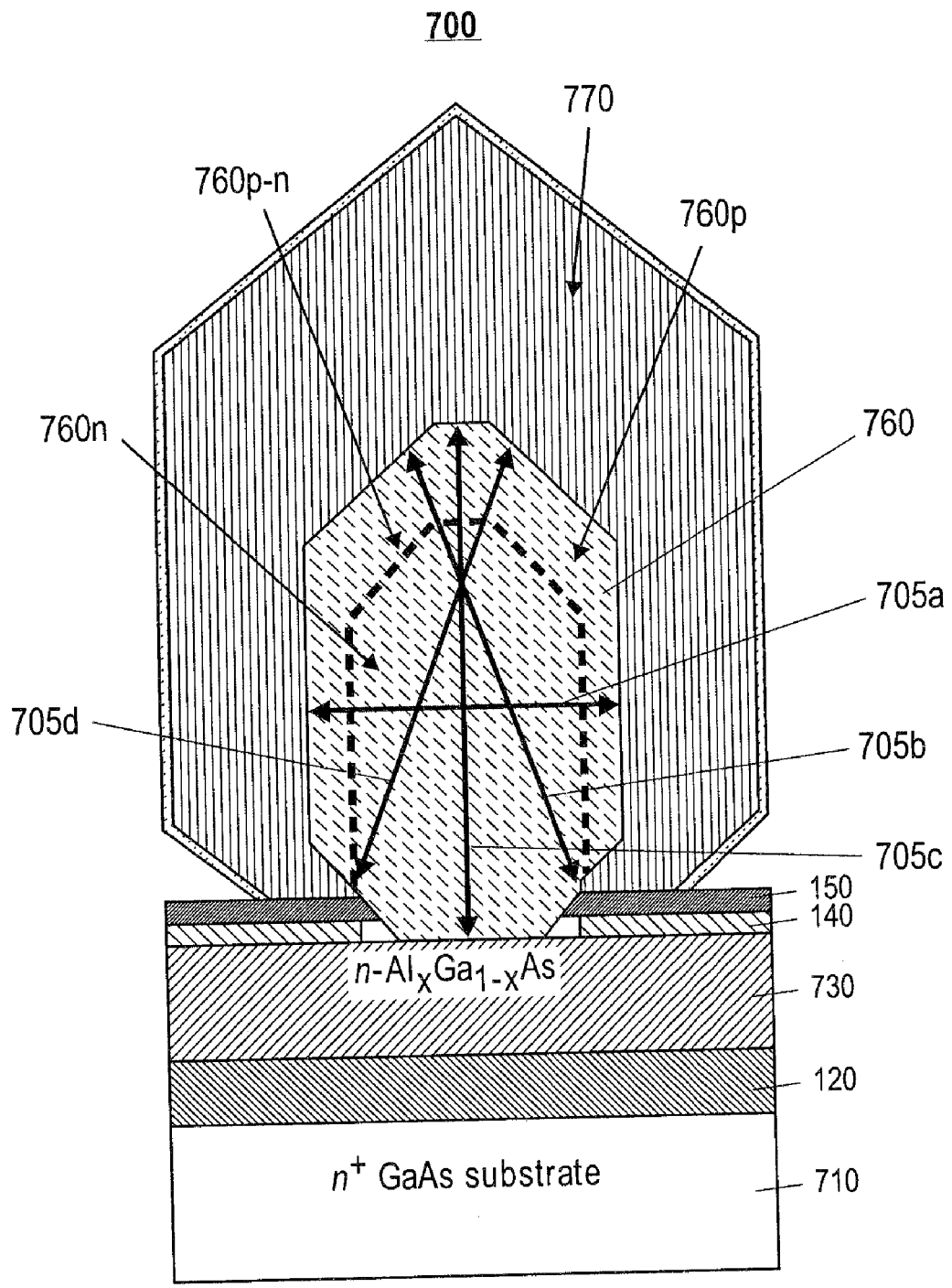
FIG. 7 depicts an exemplary nanowire laser diode (LD) device in accordance with various embodiments of the present teachings.

FIG. 7 shows an example of a nanowire LD device 700 grown on an exemplary n$^+$ GaAs substrate 710 in accordance with various embodiments of the present teachings. As shown, double-headed arrows 705a-d in the exemplary GaAs nanowire core 760 can indicate available cladding pairs formed by the parallel faceted regions at the $GaAs/Al_xGa_{1-x}$ As interface, wherein the exemplary $Al_xGa_{1-x}As$ layer 770 is a cladding layer.

After a formation of the nanowire core 760, various regions can be defined within the nanowire core 760. For example, after the initial nanopatterning, an exemplary n doped GaAs 760n can be formed, followed by a formation of p-n junction region 760 p-n with undoped GaAs, which is covered by an exemplary p doped GaAs 760p. By keeping the lateral size of a nanowire comparable with its lasing wavelength, a single mode laser can be achieved. High power lasing can then be obtained from an array of such single mode lasers of which the period is close enough for optical coupling between neighbor lasers. Conventional top and bottom or coplanar metal contacts can also be employed.

Figure 7A:
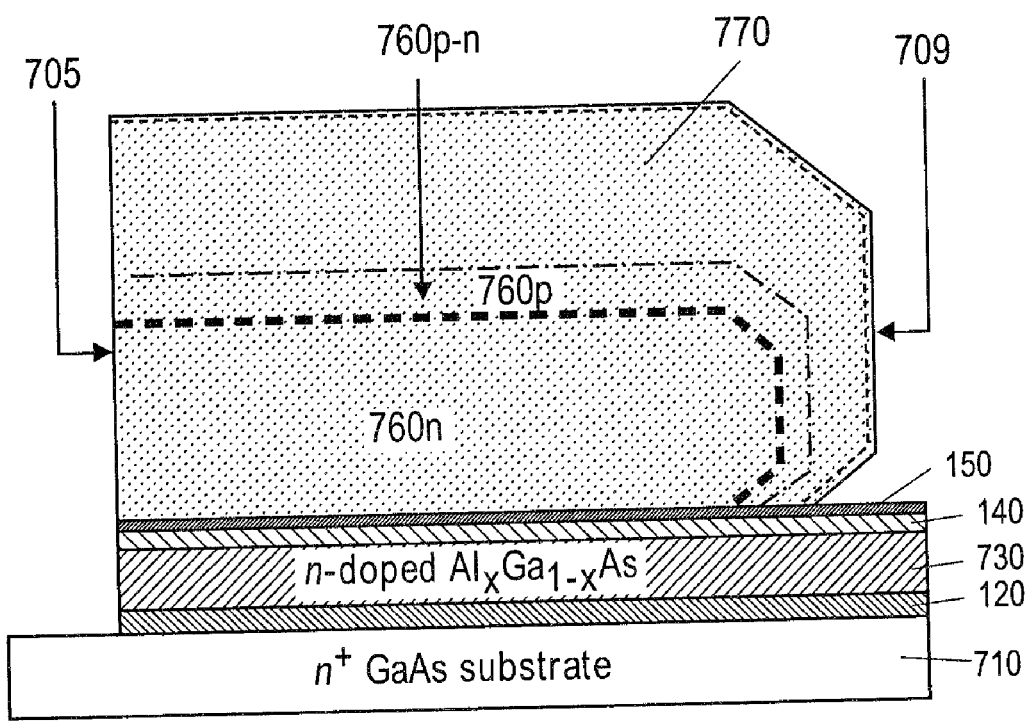

FIG. 7A depicts a side view schematic for the nanowire LD device 700 of FIG. 7 in accordance with various embodiments of the present teachings. As shown, the LD device 700 can also include end mirrors including an etched mirror 705 and an epitaxially grown mirror 709. The end mirrors 705/709 for LD 700 can be constructed by etching or epitaxial growth of vertical facets. Since the nanowires can have very small cross sections perpendicular to the wire direction (~λ/2n), the mirrors 705l709 may not need to be strictly vertical to the substrate 110, and also chemical or dry etching can be used for mirror fabrication. In various embodiments, the conductivity type of the semiconductor materials or the epilayers described herein can be reversed between an n-type and a p-type in accordance with various embodiments of the present teachings.

According to FIGS. 7-7A, various embodiments can thus include a method for forming a nanowire device. Such device can be formed by first forming an in-plane nanowire core as disclosed herein. The in-plane nanowire core can further be formed by first forming an n-doped region, then forming a p-n junction region of an undoped layer surrounding the n-doped region, and then forming a p-doped region surrounding the p-n junction region of the undoped layer. A shell layer using a higher bandgap material can then be formed surrounding the in-plane nanowire core having an interface of bandgap discontinuity. Such interface can include a plurality of cladding pairs formed by parallel faceted regions of the in-plane nanowire core. In embodiments, end mirrors of a laser diode can be formed either with faceting in epitaxial growth or by etching in device process. In embodiments, lateral size of the in-plane nanowire core that supports only a single transverse mode of the radiation field of the LD can also be controlled.

Various steps described above for forming in-plane nanowires and nanowire devices, referring to FIGS. 1-7, can be added, omitted, combined, altered, or performed in different orders in accordance with various embodiments of the present teachings.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a nanowire comprising:
    providing a crystalline growth platform formed on a substrate;
    providing a protection layer on the crystal growth platform;
    defining one or more nanoscale slit-shaped openings in a selective growth mask formed on the protection layer, wherein a length of the nanoscale slit-shaped openings is oriented along a crystal direction of the crystalline growth platform;
    locally removing the protection layer in a vicinity of each nanoscale slit-shaped opening to expose a surface of the underlying crystalline growth platform; and
    forming an in-plane nanowire by epitaxially growing a material from the exposed surface of the crystalline growth platform through the nanoscale slit-shaped opening of the selective growth mask.

2. The method of claim 1, wherein the local removal of the protection layer comprises a thermal removal, a chemical removal or a removal with cracked hydrogen atoms to expose the surface of the underlying crystalline growth platform.

3. The method of claim 1, wherein the nanoscale slit-shaped opening has a width ranging from about 10 nm to about 1 μm.

4. The method of claim 1, wherein the in-plane nanowire has a cross sectional shape comprising a pentagon, a hexagon or any polygon formed by faceting of an epilayer initially grown in the nanoscale slit-shaped opening.

5. The method of claim 1, wherein the material used for epitaxially growing the in-plane nanowire comprises one or more of AlAs, GaAs, InAs, AlSb, GaSb, InSb, AlP, GaP, InP, AlN, GaN, InN, Si, Ge, CdTe, HgTe, ZnSe, and ternary, quaternary or quinary alloys thereof.

6. The method of claim 1, wherein the crystalline growth platform comprises at least one blanket epitaxial layer formed over the substrate, the at least one blanket epitaxial layer comprising an aluminum mole fraction selected for a selective oxidation.

7. The method of claim 1, wherein the crystalline growth platform comprises a distributed Bragg reflector.

8. The method of claim 1, wherein the crystalline growth platform comprises multi-layers having different Al compositions.

9. The method of claim 1, wherein the protection layer comprises an amorphous semiconductor, a dielectric layer, or a group V film, and the substrate comprises a crystalline substrate comprising one or more of GaN, GaAs, GaSb, InP, SiC, $Al_2O_3$, Si, Ge, CdTe, ZnSe or combinations thereof.

10. The method of claim 1, further comprising a lithographic process comprising one or more of an optical lithography, an interferometric lithography, a nanoimprint lithography, an electron-beam lithography, or an ion-beam lithography so as to form the nanoscale slit-shaped openings.

11. An in-plane nanowire formed according to the method of claim 1.

12. The method of claim 1, further comprising forming a plurality of in-plane nanowires oriented along the crystal direction of the underlying crystalline growth platform.

13. A nanowire array formed according to the method of claim 12, further comprising a center-to-center spacing ranging from about 50 nm to about 5 μm between adjacent two nanowires.

14. The method of claim 1, further comprising growing a contact pad from each end of the in-plane nanowire along the length of the in-plane nanowire, wherein the contact pad connects the end of the in-plane nanowire by a tapered connection.

15. A field effect transistor (FET) device formed according to the method of claim 14, wherein the FET device comprises a wrap-around gate scheme.

* * * * *